United States Patent [19]

Higashiguchi et al.

[11] Patent Number: 5,760,469

[45] Date of Patent: Jun. 2, 1998

[54] SEMICONDUCTOR DEVICE AND SEMICONDUCTOR DEVICE MOUNTING BOARD

[75] Inventors: Yutaka Higashiguchi; Mitsuo Inagaki; Toshio Kumai; Ryoichi Ochiai; Yasuhiro Teshima; Mamoru Niishiro; Yasushi Kobayashi; Hideaki Tamura; Hiroshi Iimura; Seishi Chiba; Yukio Sekiya; Shuzo Igarashi; Yasuhiro Ichihara, all of Kawasaki, Japan

[73] Assignee: Fujitsu Limited, Kawasaki, Japan

[21] Appl. No.: 602,421

[22] Filed: Feb. 16, 1996

[30] Foreign Application Priority Data

Jul. 31, 1995 [JP] Japan .................................. 7-195456

[51] Int. Cl.⁶ .................. H01L 23/02; H01L 23/48; H01L 23/52; H01L 29/40

[52] U.S. Cl. .................. 257/678; 257/693; 257/698; 257/774; 438/106

[58] Field of Search .................. 257/690, 692, 257/693, 697, 698, 787, 792, 796, 678, 780, 774, 688, 786, 684; 438/375, 376, 377, 378, 55

[56] References Cited

U.S. PATENT DOCUMENTS 5,309,026 5/1994 Matsumoto .................. 257/787

FOREIGN PATENT DOCUMENTS

| 2-041451 | 3/1990 | Japan . | |
|---|---|---|---|
| 5144995 | 6/1993 | Japan | 257/700 |
| 6053362 | 2/1994 | Japan | 257/796 |

Primary Examiner—Mahshid D. Saadat
Assistant Examiner—Jhihan B. Clark
Attorney, Agent, or Firm—Staas & Halsey

[57] ABSTRACT

A semiconductor device includes a package having opposing surfaces, a first terminal for an outer connection supported by said package and electronic components supported by said package, and the opposing surfaces of the package having slits so that a shape of the package can be changed in a mounted state. Therefore, stress applied to soldered junctions of the first and second terminals is decreased.

23 Claims, 14 Drawing Sheets

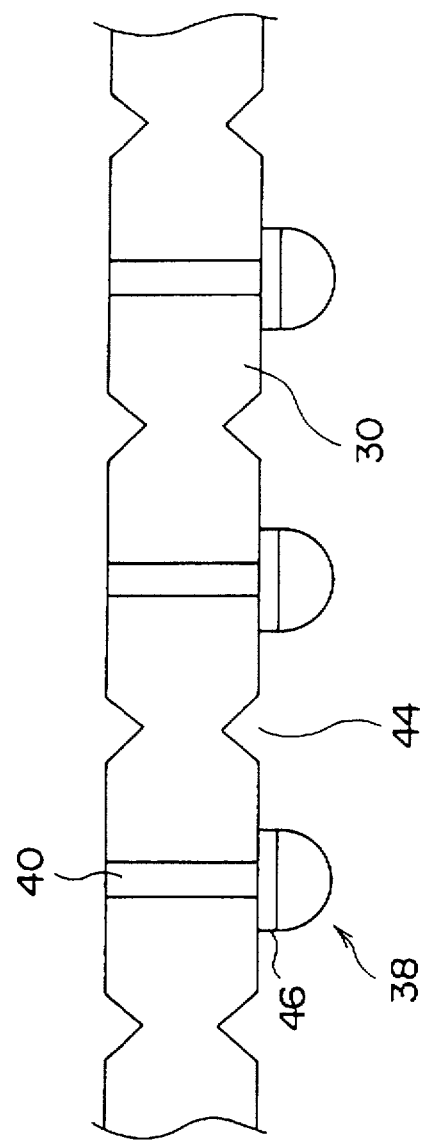

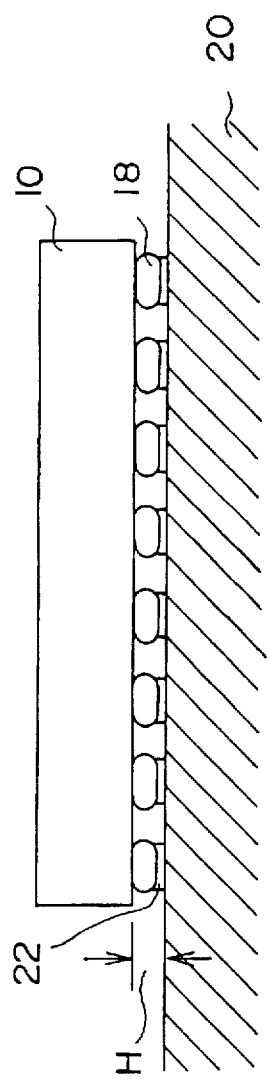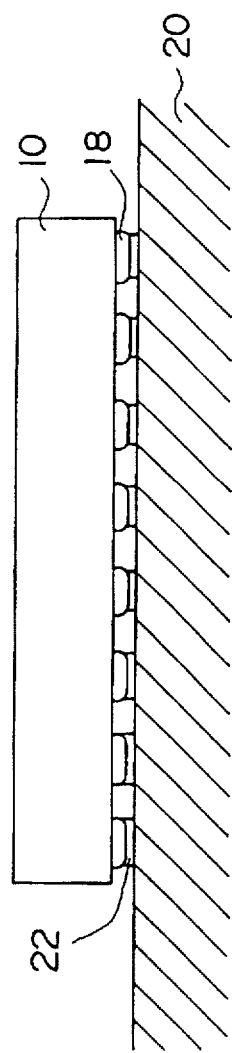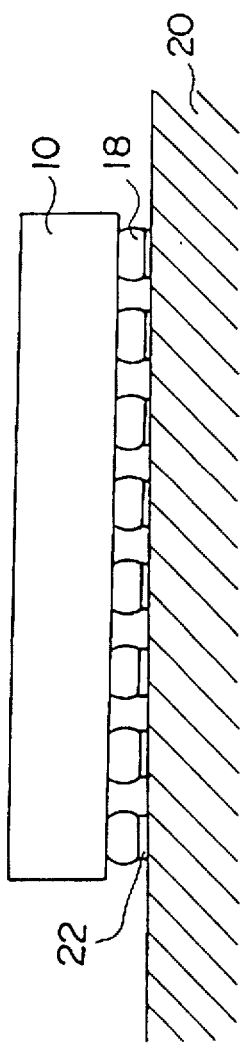
FIG. 8A
FIG. 8B
FIG. 8C

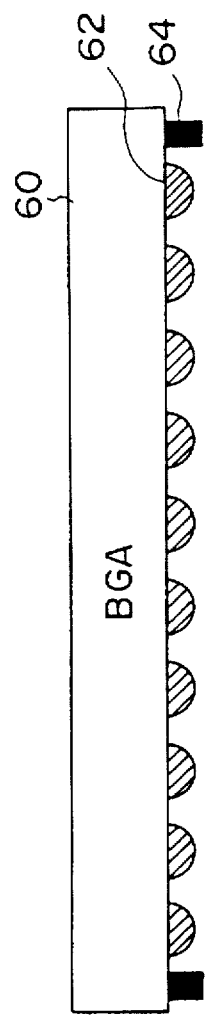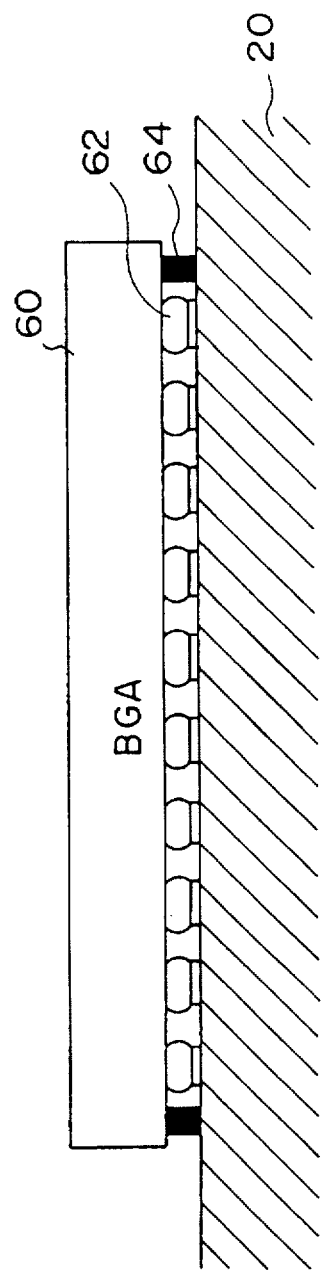
FIG. 9A
FIG. 9B

FIG. 20
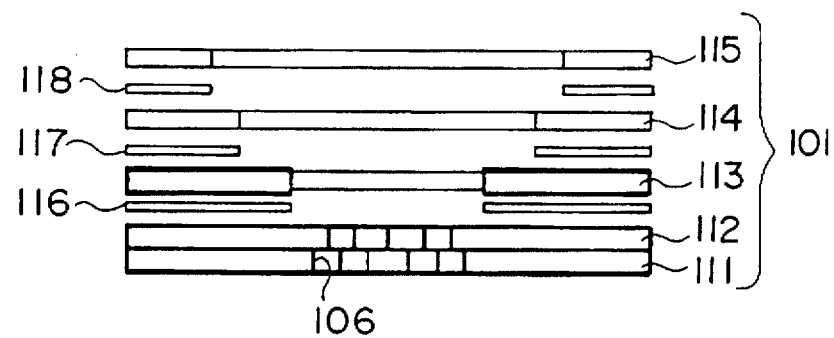
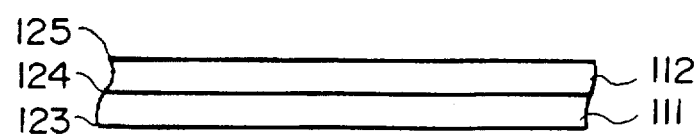
FIG. 21A
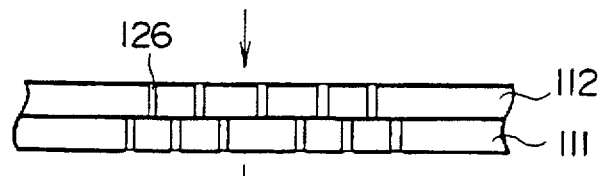
FIG. 21B
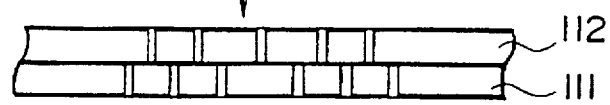
FIG. 21C

SEMICONDUCTOR DEVICE AND SEMICONDUCTOR DEVICE MOUNTING BOARD

BACKGROUND OF THE INVENTION

1. Field of the Invention

The present invention generally relates to semiconductor devices in which electronic components such as semiconductor chips are supported on a wiring board, and particularly, to a semiconductor device of a ball grid array (hereinafter referred to as BGA) type. More specifically, the present invention relates to a configuration of the BGA type semiconductor device in which the reliability of electrical connection is improved in a mounted state on a board.

Recently, the semiconductor chips have been highly integrated and there are demands for dense mounting of the semiconductor devices. The BGA type semiconductor device has attracted attention, in which, compared to a QFP type semiconductor device, terminals for an outer connection are provided on one surface of the device in an array with wider pitch and an occurrence of deformation of the terminal is low. In the QFP type semiconductor device, on the other hand, since the terminals for an outer connection are provided around the device, it is easy to check the electrical connection, after mounting the device on a mother board (also referred to as printed board, circuit board, wiring board, mounting board or simply a board), between the terminals for an outer connection and the terminals of the mother board and correct a problem if it exists.

In the BGA type device, however, since terminals in the form of balls are provided in an array on one surface, it is difficult to visually check the electrical connection once it is mounted on mother board and, even if the check can be made, it is extremely difficult to correct a problem.

Therefore, higher reliability of the connection to the mother board is required for the BGA type semiconductor device than for the QFP type device.

2. Description of the Related Art

A conventional BGA type semiconductor device will be explained with reference to FIG. 1. In FIG. 1, a BGA type semiconductor 10 is comprised of a base 12 including wiring, a semiconductor chip (LSI chip) 14 which is a bare chip, a sealing member 16 and SnPb solder bumps 18 of a ball-shape. The base 12 and the sealing member 16 are combined and form a package. Electrodes (not shown) provided on the semiconductor chip 14 and those provided on the surface of the base 12 are bonded by wires. The electrodes provided on the surface of the base 12 are electrically connected to the solder bumps 18 provided on the back of the base 12 via wiring layers formed in the base, throughholes and so on. The surface of the semiconductor chip 14 and that of the base 12 are sealed by the sealing member 16 made of resin as shown in FIG. 1. The solder bumps 18 function as portions for an outer connection (electrodes) and are arrayed in a matrix on the back of the base 12. In general, the spacing T between each of the solder bumps 18 is less than 1.5 mm.

The above-mentioned BGA type semiconductor device 10 may be mounted on the mother board 20, which is a glass epoxy board as shown in FIG. 1. Foot prints 22 (referred to also as electrodes or terminals) are arrayed in a matrix and wiring is provided on the mother board 20 and the solder bumps 18 are soldered to the foot prints 22 on the mother board 20.

In the BGA type semiconductor device 10 shown in FIG. 1, however, since the solder bumps (terminals) 18 of a ball-shape are formed on the entire surface facing the mother board 20, it is difficult to visually check the electrical connection once it is mounted and, even if the check can be made, it is extremely difficult to correct a problem. A configuration of the BGA type semiconductor device is required, therefore, which can assure high reliability in the electrical connection, after mounting, between the BGA type semiconductor device 10 and the mother board 20 at soldered junctions.

FIG. 2 shows an example of problems associated with the prior art. Referring to FIG. 2, the bump 18, which is comprised of a Cu core and Ni—Au plated thereon, is formed on a pad 24 (also referred to as a land or terminal) provided on the base 12. After printing solder paste on the foot print 22 using metal mask, the semiconductor device 10 is mounted on the paste and a solder reflowing process is carried out. At that time, a soldered junction 26 (electrically connected portion) of fillet form is produced.

After that, if a bending or twisting is applied to the mother board 20 due to an outside force, stress is applied to the soldered junction 26 and if it is applied continuously for some periods, cracks 28 are generated. If the cracks 28 are formed inside of the soldered junction 26, they may be detected but it is very difficult to fix them.

SUMMARY OF THE INVENTION

It is a general object of this invention to provide a semiconductor device and a semiconductor device mounting board in which above-mentioned problems are eliminated.

A more specific object of the present invention is to provide a semiconductor device and a semiconductor device mounting board in which reliability in electrical connection, after mounting the semiconductor device on the board, is improved.

The objects described above are achieved by a semiconductor device comprising: a package having opposing surfaces; a first terminal for an outer connection supported by the package; and electronic components supported by the package, wherein the opposing surfaces of the package have slits so that the shape of the package can be changed in a mounted state, in which the first terminal is fixed to a second terminal provided on a wiring board, so that stress applied to soldered junctions of the first and second terminals can be decreased.

The object described above is also achieved by the semiconductor device mentioned above, wherein the slits are formed in straight lines extending in two different directions.

The object described above is also achieved by the semiconductor device mentioned above, wherein the slit has a cross-section of substantially V-shape.

The object described above is also achieved by the semiconductor device mentioned above, wherein the first terminal includes at least one solder bump having substantially a ball-shape.

According to the above semiconductor devices, stress applied to the soldered junction of the first and the second terminals is decreased and reliability of the electrical connection between the first and the second terminals is improved.

The object described above is achieved by a semiconductor device comprising: a package; a terminal for an outer connection supported on a predetermined surface of the package; electronic components supported by the package; and a plurality of projecting portions supported on the predetermined surface of the package, the projecting portions having a height higher than that of the terminal for the outer connection, wherein the plurality of projecting portions maintains a predetermined distance between the predetermined surface of the package and a wiring board when the semiconductor device is mounted on the wiring board.

The object described above is also achieved by the semiconductor device mentioned above, wherein the projecting portions are provided at corners of the predetermined surface of the package.

According to the above semiconductor devices, the distance between the predetermined surface of the package and the wiring board is maintained constant in a mounted state of the semiconductor device on the wiring board, therefore, reliability of the electrical connection at soldered junctions is improved.

The object described above is achieved by a semiconductor device comprising: a package; solder bumps having a ball-shape for an outer connection and supported by the package; and electronic components supported by the package, wherein the solder bumps have a ground surface and the ground surface is connected to a terminal provided on a wiring board.

According to the above semiconductor devices, the height of each solder bump is made to be equal by grinding and reliability of the electrical connection at soldered conjunctions is improved.

The object described above is achieved by a semiconductor device comprising: a package; solder bumps of having a ball-shape for an outer connection and supported by the package; electronic components supported by the package; and a solder-repelling coating comprising a material having a property for repelling solder, the coating provided between the solder bumps.

The object described above is also achieved by the semiconductor device mentioned above, wherein the solder-repelling coating is provided in a lattice form so as to surround the solder bumps.

The object described above is also achieved by the semiconductor device mentioned above, wherein the solder-repelling coating is provided on the entire surface of the package except on the solder bumps.

According to the above semiconductor devices, a formation of a "solder-bridge" can be avoided because of the solder-repelling coating provided and reliability of the electrical connection at soldered junctions is improved.

The object described above is achieved by a semiconductor device comprising: a package; solder bumps having a ball-shape for an outer connection supported by the package; electronic components supported by the package; and thermal vents, provided in the package, for transferring heat from the electronic components externally of the package, wherein the thermal vents are provided in a non-straight form.

According to the above semiconductor devices, since the thermal vents are provided in a non-straight form, the possibility that permeated water reaches the electronic components, such as the semiconductor chip, is extremely small and reliability of the electrical connection is improved.

The object described above is achieved by a semiconductor device mounting board comprising: a base; a first terminal, provided on a first surface of the base, soldered to a solder bump having a ball-shape of a semiconductor device; a second terminal, provided on a second surface of the base, soldered to a terminal provided on a wiring board; and a connecting member for connecting the first terminal with a second terminal, wherein a thermal expansion coefficient of the base is between a thermal expansion of the semiconductor device and a thermal expansion coefficient of the wiring board.

The object described above is also achieved by the semiconductor device mounting board mentioned above, wherein the connecting member comprises a connecting conductor provided in a throughhole formed in the base.

According to the above semiconductor device mounting boards, the difference in the thermal expansion coefficient between the semiconductor device and the wiring board is absorbed by the base and reliability of the electrical connection between the semiconductor device and the wiring board is improved.

Other objects and further features of the present invention will be apparent from the following detailed description when read in conjunction with the accompanied drawings.

DESCRIPTION OF THE PREFERRED EMBODIMENTS

Figure 3:
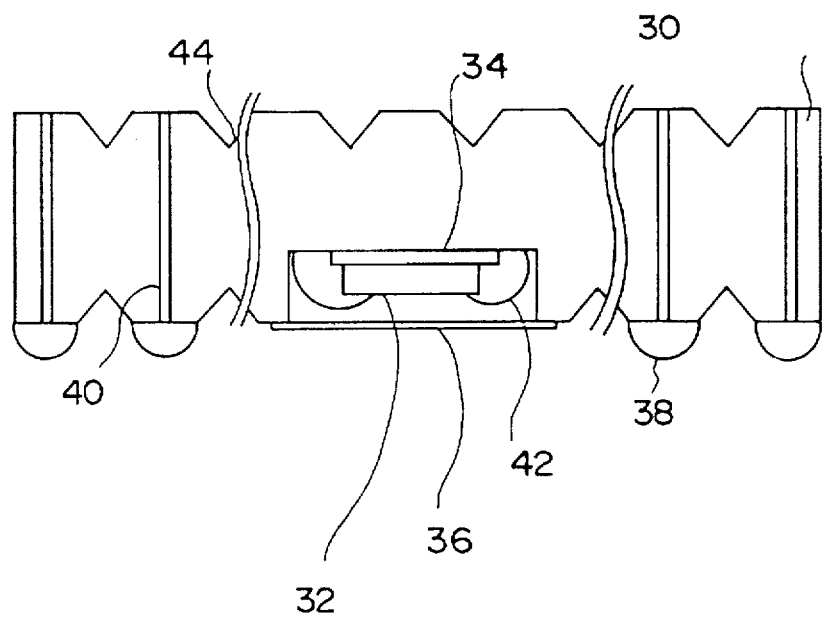
FIG. 3 shows a cross section of a main part of the BGA type semiconductor device according to the first embodiment of the present invention.
Figure 4:
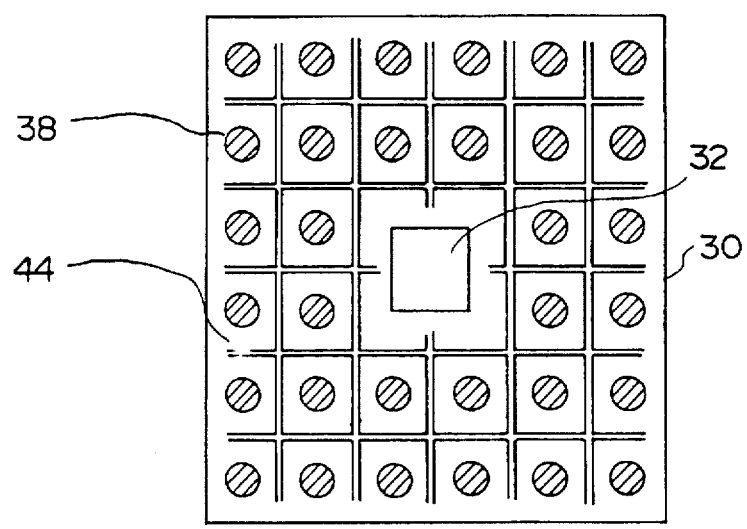
FIG. 4 shows a plan view of the BGA type semiconductor device according to the first embodiment of the present invention.
Figure 5:
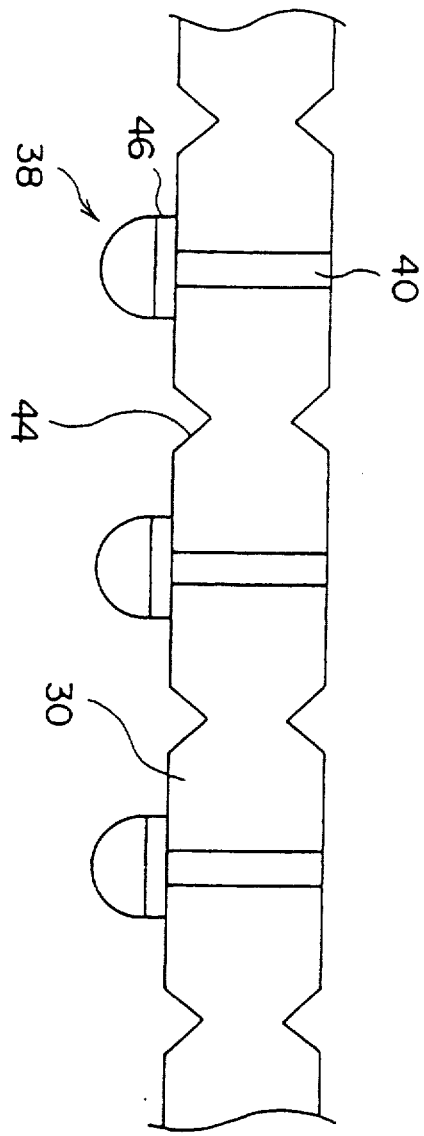
FIG. 5 shows a partially enlarged cross-sectional view of the BGA type semiconductor device according to the first embodiment of the present invention.
Figure 7A:
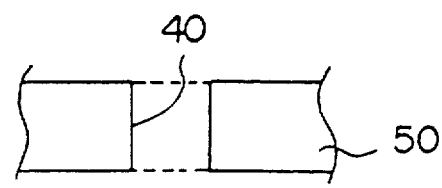
Figure 7B:
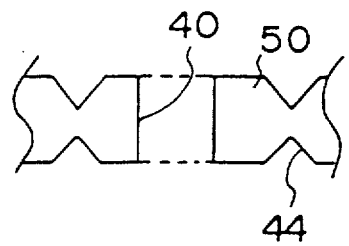
Figure 7C:
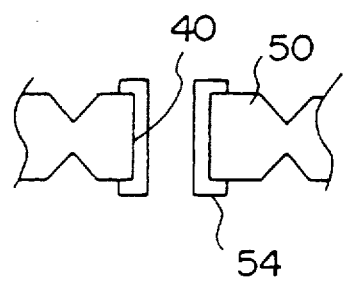
Figure 7D:
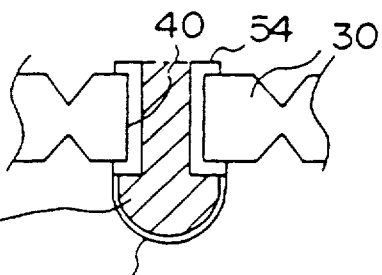

A description will be given of a first embodiment of a semiconductor device according to the present invention, by referring to FIGS. 3, 4 and 5. FIG. 3 shows a partial cross-sectional view of a BGA type semiconductor device according to the first embodiment of the present invention. FIG. 4 shows a plan view of the BGA type semiconductor device shown in FIG. 3 and FIG. 5 shows a partial enlarged cross-sectional view of the BGA type semiconductor device shown in FIG. 3. The first embodiment is characterized in that the structure of the package of the BGA type semiconductor device is made flexible.

As shown in FIGS. 3 to 5, the BGA type semiconductor device is comprised of a package 30, an LSI bare chip 32 fixed by Ag epoxy adhesive 34, bonding wires 42, a metal cap 36 for sealing the bare chip 32, ball-shaped solder bumps 38 formed on pads 46 (see FIG. 5) and a throughhole 40 in which a conductor such as copper is provided. The package 30 is a board, for example, formed of organic materials such as glass epoxy in which wiring patterns formed of a metal such as copper or aluminum, for example, are provided. If a package formed of metal is used, it is necessary to insulate the wiring patterns from the metallic package using insulating materials.

More specifically, the first embodiment is characterized in that slits (grooves) 44 which make the package flexible to bending or twisting of the mother board are provided on both sides of the package. As shown in FIG. 4, the slits 44 are formed in longitudinal and transverse directions so as to cross between each of the bumps 38. The slits 44 are also formed in longitudinal and transverse directions on the other side of the package 30. The cross section of the slit 44 is of a V-shape as shown in FIG. 3. As mentioned above, the package 30 can be formed of organic materials such as glass epoxy or metals such as aluminum, however, it is not preferable to use ceramics for forming the slits 44 since cracks can easily be generated on the ceramics.

Figure 6:
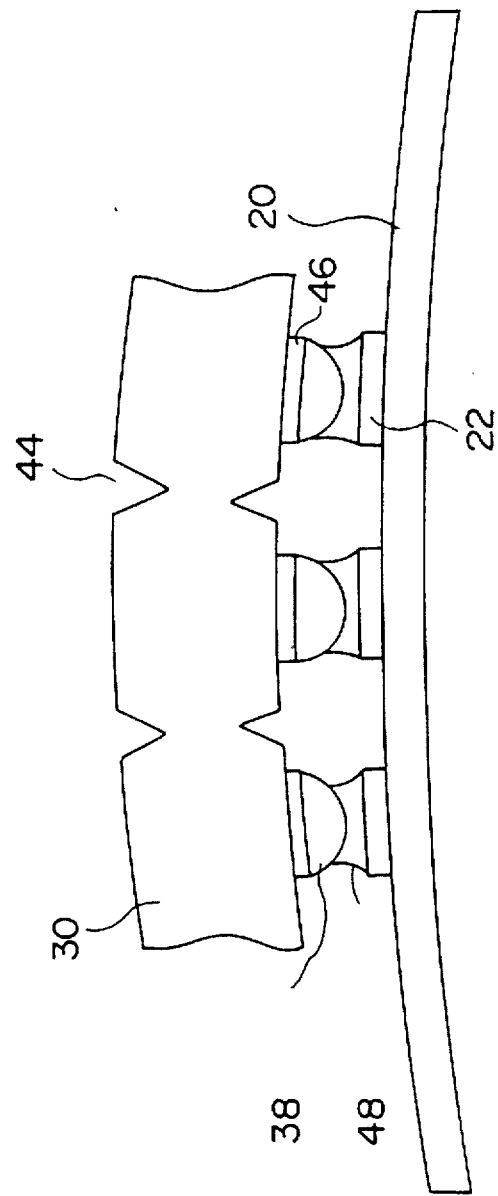
FIG. 6 shows a state in which the BGA type semiconductor device according to the first embodiment is mounted on a mother board (wiring board)

FIG. 6 shows the state where the BGA type semiconductor device shown in FIGS. 3 to 5 is mounted on the mother board 20. Each of the solder bumps 38 is connected to a respective footprint 22 electrically and mechanically through a soldered junction 48 of a fillet shape. As shown in FIG. 6, if the mother board 20 is bent, the shape of the package 30 is transformed corresponding to the bending. More specifically, the lower side of the package 30 is contracted and the upper side is elongated in order to absorb stress applied to the soldered junction 48. Also, since the slits 44 are formed in longitudinal and transverse directions on both sides of the package 30, it can cope with a distortion from any direction.

In addition, the depth of the slit 44 is approximately 0.3 mm when the thickness of the package 30 is 1.9 mm, for example.

Figure 7A:
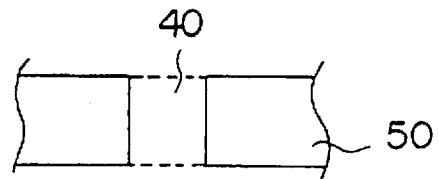
FIG. 7A shows a formation of a throughhole in a basic material during a process for forming a slit and a throughhole provided in a package of the BGA type semiconductor device according to the first embodiment.
Figure 7B:
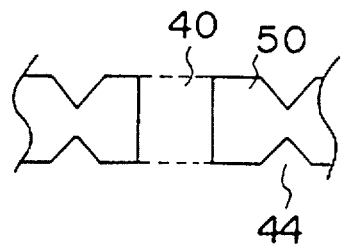
FIG. 7B shows a formation of a slit during a process for forming a slit and a throughhole provided in a package of the BGA type semiconductor device according to the first embodiment.
Figure 7C:
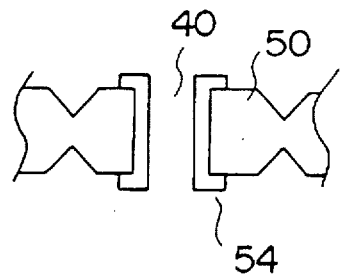
FIG. 7C shows a patterning of the throughhole during a process for forming a slit and a throughhole provided in a package of the BGA type semiconductor device according to the first embodiment.
Figure 7D:
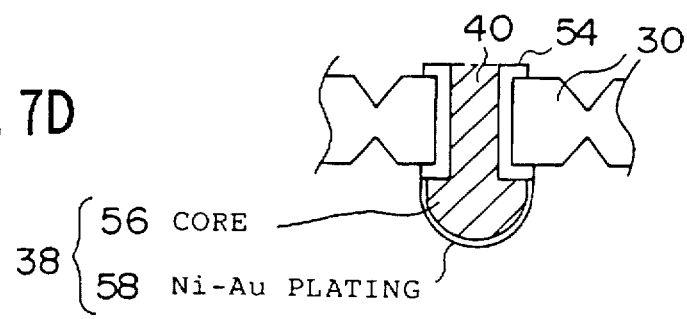
FIG. 7D shows a core loading and plating thereof during a process for forming a slit and a throughhole provided in a package of the BGA type semiconductor device according to the first embodiment.

FIGS. 7A to 7D show a process for forming the slit 44 and the throughhole 40 in the package 30. Firstly, the throughhole 40 is formed in a basic material 50 (glass epoxy, for instance) of the package 30 using appropriate instruments as shown in FIG. 7A. Secondly, the slits 44 are formed on both sides of the basic material 50 as shown in FIG. 7B. Then, as shown in FIG. 7C, the pattern 54 is formed using patterning and metal plating techniques. A pattern 54 is formed not only on the surface of the throughhole 40 but also on both sides of the basic material 50. Finally, copper is loaded in the throughhole 40 and on one surface of the basic material 50 in order to form a core 56 of the bump 38. The surface of the core 56 is plated with Ni—Au as shown at 58 in FIG. 7D.

In addition, although the slits 44 are provided between each of the bumps 38 in FIG. 4, it is possible to select the number or the pitch of the slits 44 according to expected situations. For example, the slits 44 can be formed between every two bumps or three bumps, or they can be densely formed at edge portions of the package and sparsely around the center of the package (or vice versa). Moreover, the throughhole 40 connected to the solder bump is not necessarily a "through" hole. There is an advantage for making use of the throughhole 40 in that the condition of a soldered junction may be visually confirmed via the throughhole 40.

Figure 8A:
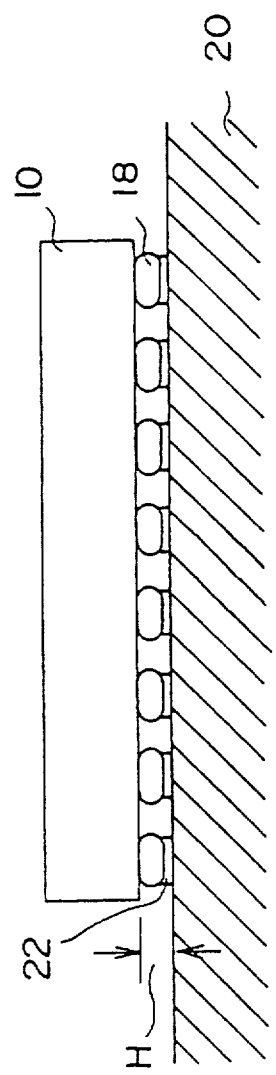
FIG. 8A shows a state where a BGA type semiconductor device is appropriately mounted on a mother board.

Next, the second embodiment according to the present invention will be described. The second embodiment also has a structure to improve the reliability of the soldered junction between the BGA type semiconductor device and the mother board. In order to clarify the characteristics of the second embodiment, corresponding problems in the prior art will be explained with reference to FIGS. 8A to 8C. FIG. 8A shows a state in which the BGA type semiconductor device 10 is appropriately mounted on the mother board 20. Solder bumps 18 are connected, using a reflowing process, to foot prints 22 on the mother board 20 via soldered junctions. In a proper mounting state, the distance H between the bottom surface of the BGA type semiconductor device 10 and the mounting surface of the mother board 20 is constant throughout the entire bottom surface of the device 10.

Figure 8B:
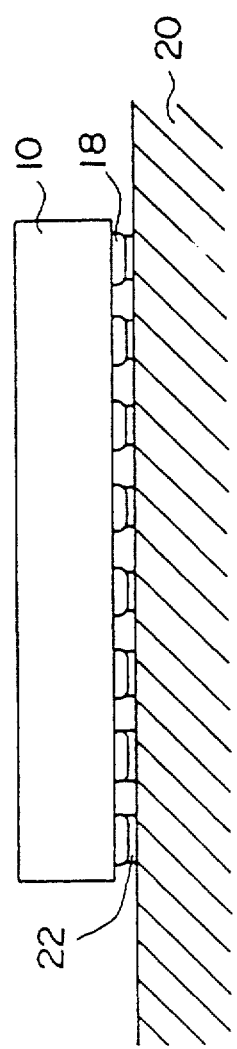
FIG. 8B shows a problem associated with prior art related to the second embodiment of the present invention where the thickness of the solder is not efficient.
Figure 8C:
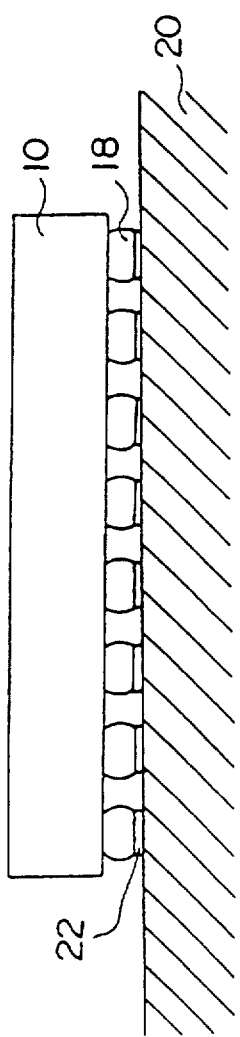
FIG. 8C shows a problem associated with prior art related to the second embodiment of the present invention where the BGA type semiconductor device is inclined relative to the mother board due to uneven thickness of the solder.

FIGS. 8B and 8C show the states where the soldered junctions are defective. In case of FIG. 8B, the thickness of each of the solder balls is not sufficient and the BGA type semiconductor device 10 is too close to the mother board 20. In this state, the thin solder cannot protect the device 10 from heat. In case of FIG. 8C, the BGA type semiconductor device 10 is inclined relative to the mother board 20 due to uneven thickness of each solder ball. In this case, stress is applied to the soldered junctions, moreover, the portion where the thickness of the solder is thin cannot stand the heat.

Figure 10:
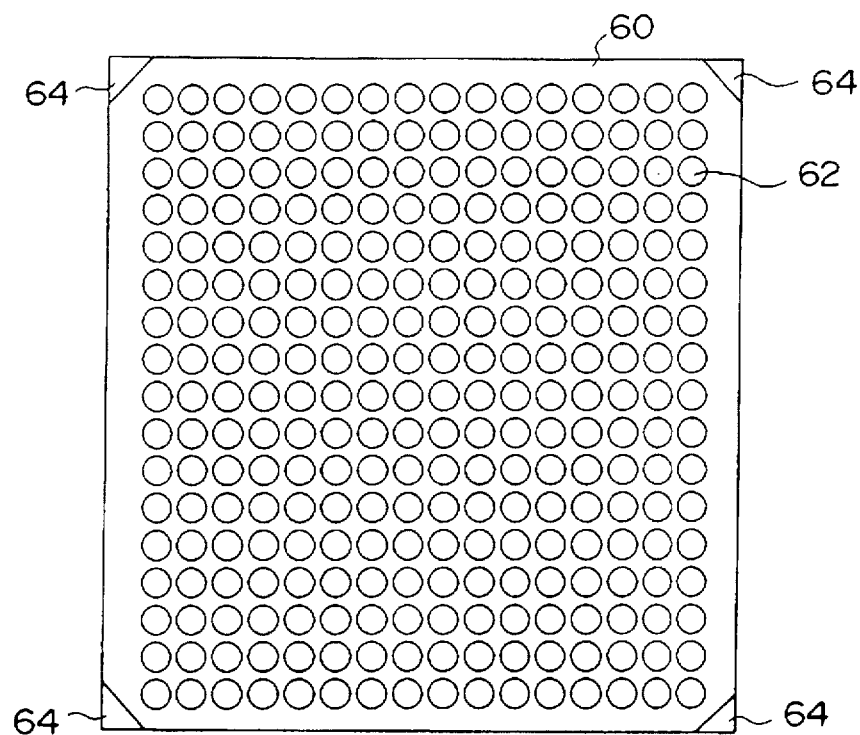
FIG. 10 shows a bottom surface of the BGA type semiconductor device according to the second embodiment of the present invention.
Figure 9A:
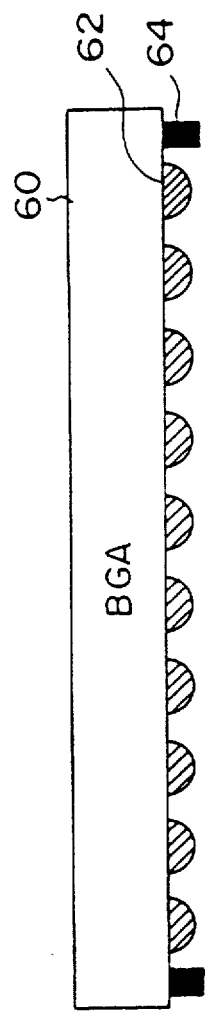
FIG. 9A shows a BGA type semiconductor device according to the second embodiment of the present invention wherein tabs are provided on one surface of the BGA type semiconductor device.
Figure 9B:
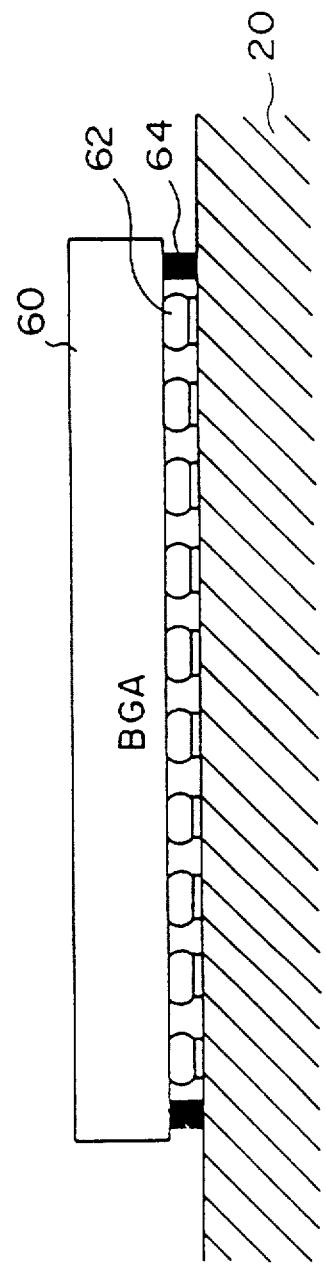
FIG. 9B shows a state in which the BGA type semiconductor device including the tabs on one surface according to the second embodiment of the present invention is mounted on a mother board.
Figure 10:
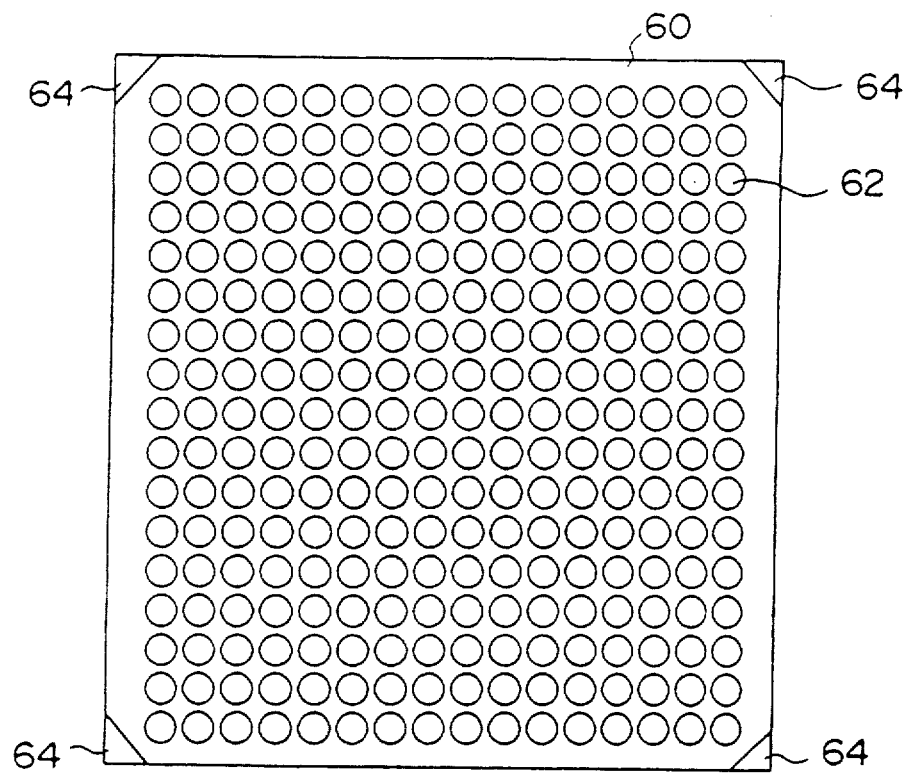
Figure 11:
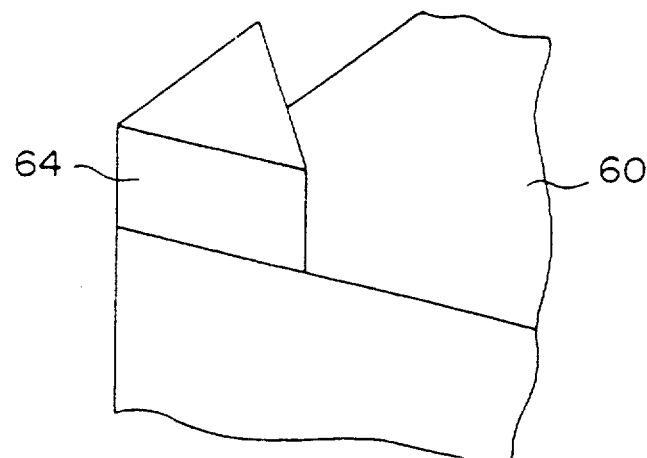
Figure 12:
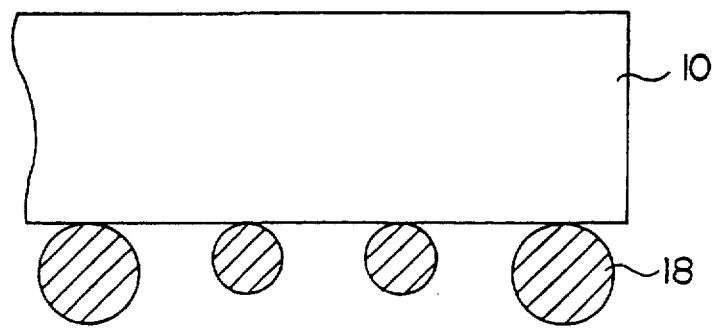
Figure 13:
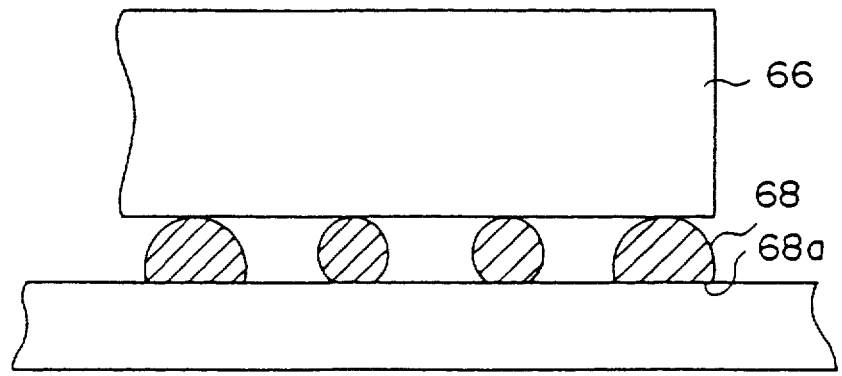
Figure 14:
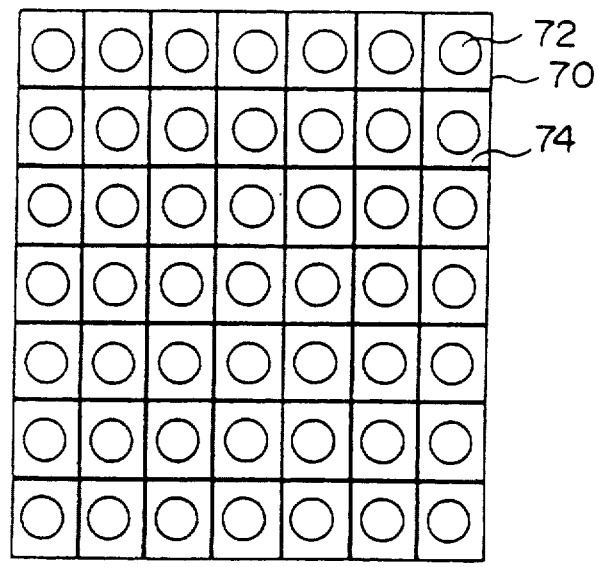
Figure 15:
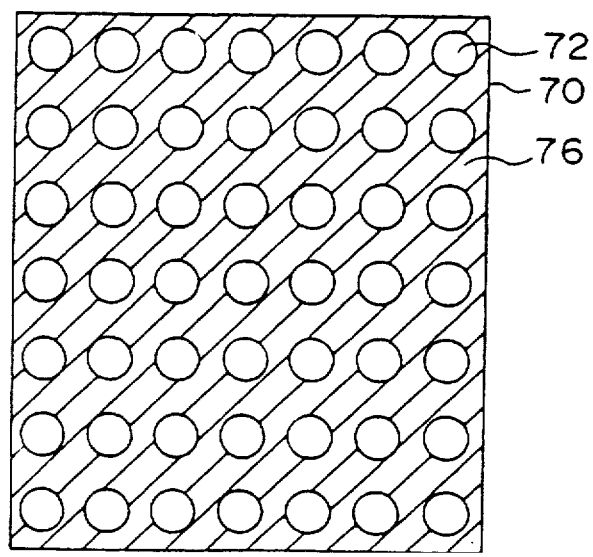
Figure 16:
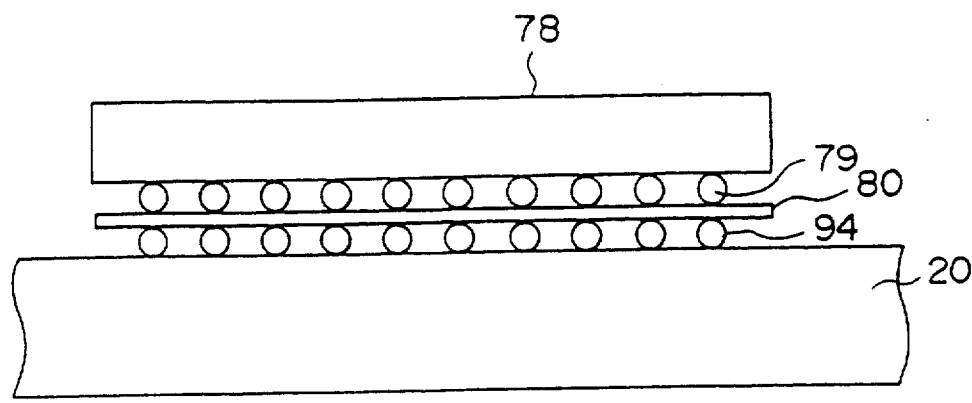
Figure 17:
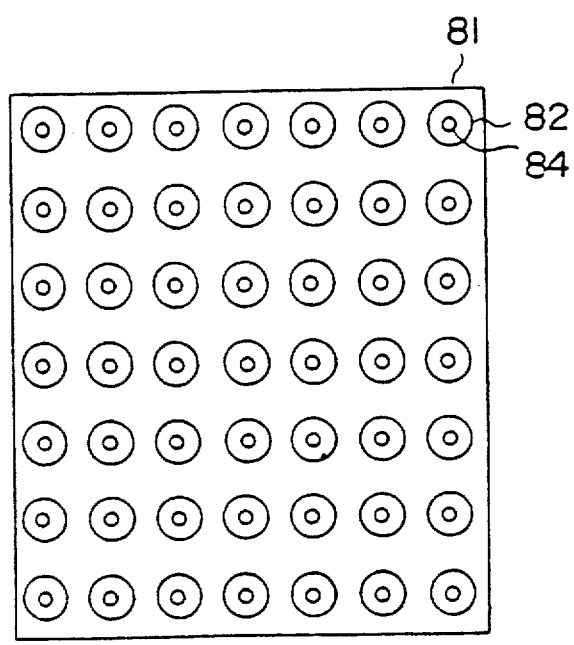
Figure 18:
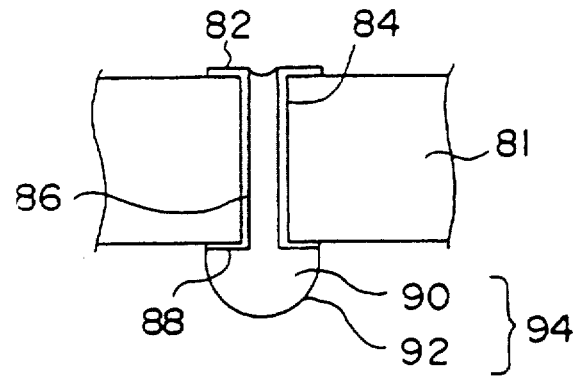
Figure 19:
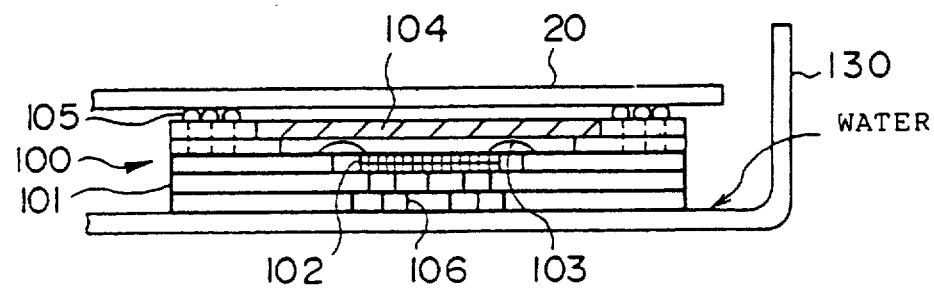

FIGS. 9A, 9B, 10 and 11 show the second embodiment according to the present invention which can prevent the formation of the above-mentioned insufficient soldered junctions. FIGS. 9A and 9B show side views of the BGA type semiconductor device according to the second embodiment and FIG. 10 shows the state of its bottom surface. The characteristic of the second embodiment is that tabs 64, projected portions, are provided at four corners of the bottom surface of the BGA type semiconductor device (bottom surface of a package 60). The height of each tab 64 is higher than that of the solder bump 62 and its function is to forcibly maintain the distance between the BGA type semiconductor device and the mother board 20 to be constant so that the thickness of all the soldered junctions becomes equal upon the reflowing process after the device is mounted on the mother board 20 as shown in FIG. 9B. The height of the tab 64 is 400–500 μm, for example, when that of the solder bump 62 is 300–400 μm. In practice, the tabs 64 can be fixed on the mounting surface using adhesives, etc., or they can be simply placed on the mounting surface. The tabs 64 are formed of materials which can withstand the heat used in the reflowing process and such materials include, for instance, resins such as glass epoxy or metals such as aluminum.

Figure 11:
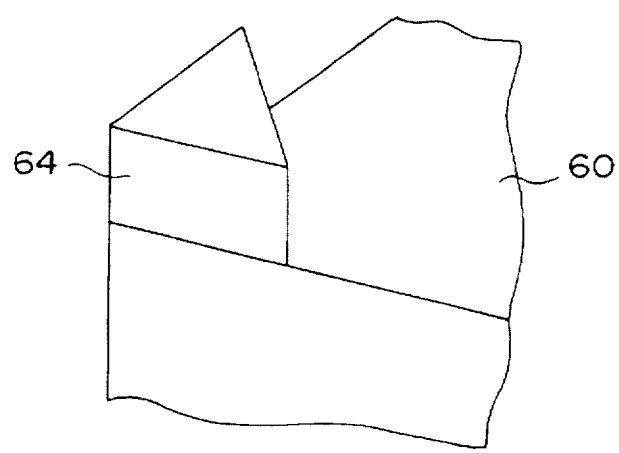
FIG. 11 shows an enlarged perspective view of a tab provided in the BGA type semiconductor device according to the second embodiment.

The shape of the tab 64 used in the second embodiment is a trigonal prism as shown in FIG. 11, however, it is not limited to such a shape and any shape of the tabs can be used.

As mentioned above, the soldered junctions may be properly formed utilizing the tabs 64. In other words, the thickness of the solder can be controlled by adjusting the height of the tabs 64 in consideration with the effect of heat and so on at the reflowing process.

Figure 12:
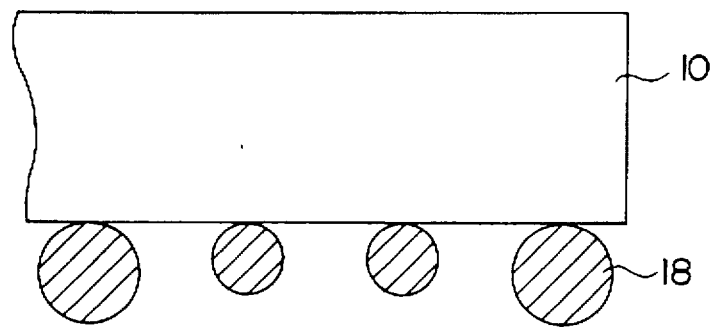
FIG. 12 shows a problem associated with prior art related to the third embodiment of the present invention.

Next, the third embodiment according to the present invention will be described in detail. The third embodiment also has a structure to improve the reliability of the soldered junction between the BGA type semiconductor device and the mother board. Now, before explaining about the third embodiment, a problem associated with a prior art related to the third embodiment will be explained with reference to FIG. 12. As shown in FIG. 12, there is a case that a difference in height is generated among the bumps 18 during an actual manufacturing process of the BGA type semiconductor device and, for that reason, there is a possibility that poor electrical connection occurs, when the device is mounted on the mother board, at a portion where the height of the bump is low.

Figure 13:
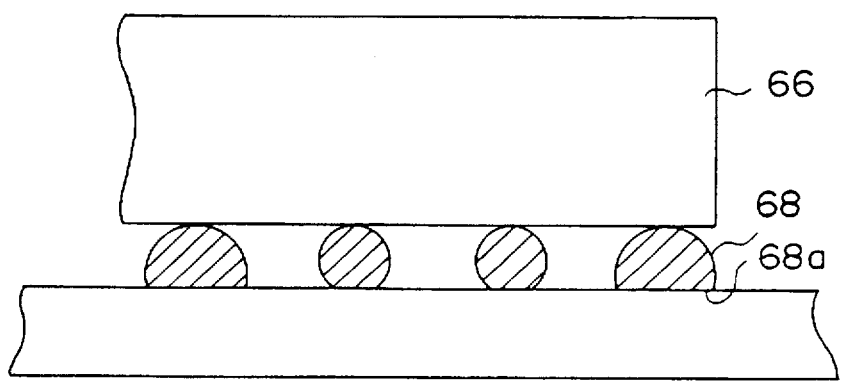
FIG. 13 shows a side view of a main part of the third embodiment.

The third embodiment is characterized in that the height of each solder bump 68 is made equal by grinding the bottom portions of them as shown in FIG. 13 after the bumps 68 are formed. The grinding is carried out so that a ground surface 68a of the solder bump 68 becomes a horizontal surface. The size of each ground surface 68a differs according to its height. In the actual process, the grinding is carried out by placing the BGA type semiconductor onto a grinding surface having appropriate roughness and moving the device by applying a uniform force. Although only one grinding surface may be used, it is possible to improve the precision of the grind by using surfaces with different roughness. The precision is in the range of one μm. By using the above-mentioned method and making the height of each solder bump 68 equal, excellent soldered junctions can be formed.

Next, the fourth embodiment according to the present invention will be explained with reference to FIG. 14. The fourth embodiment also improves the reliability of the electrical connection at the soldered junctions as in the first to the third embodiments. The fourth embodiment is characterized in that it has a structure to prevent a formation of a so-called solder-bridge caused by a melting of the solder during the reflowing process.

Figure 14:
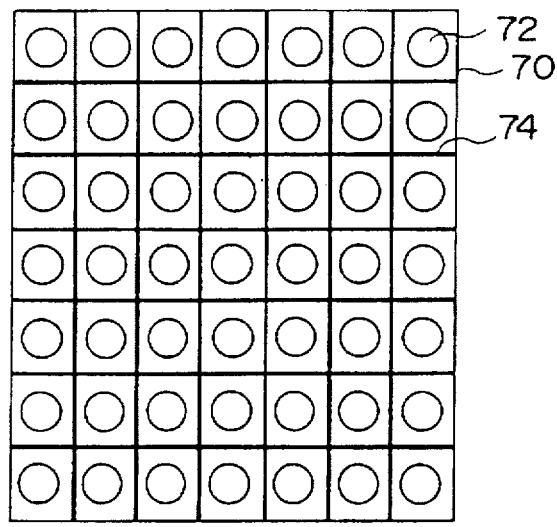
FIG. 14 shows a bottom surface of the BGA type semiconductor device according to the fourth embodiment of the present invention.

FIG. 14 shows the bottom surface of the BGA type semiconductor according to the fourth embodiment of the present invention. As shown in FIG. 14, solder bumps 72 are provided in a matrix array at the bottom surface of a package 70 made of glass epoxy, etc., and a solder-repelling coating 74 is formed in line (in lattice) in longitudinal and transverse directions between the solder bumps 72. The solder-repelling coating is formed of, for example, silicon and has a property to repel solder. The height of the solder-repelling coating 74 needs to be about the same height as a pad, on which the solder bump 72 is formed, to generate a significant effect. Since the solder-repelling coating is provided between the adjacent solder bumps, solder which becomes unnecessary in the reflowing process is repelled by the coating 74 and the formation of the solder-bridge, in which melted solder randomly connects unrelated solder bumps 72 and can cause a mess of the electrical connection in the device, is prevented.

The solder-repelling coating 74 in lattice form can be produced using a known transferring process, dispenser method, mesh-mask method and so on. It is possible to produce the solder-repelling coating 74 before forming the solder bumps 72, or after forming the solder bumps 72. Also, the solder-repelling coating 74 can be formed on the mounting surface of the mother board. In this manner, the generation of the solder bridge can be prevented.

Figure 15:
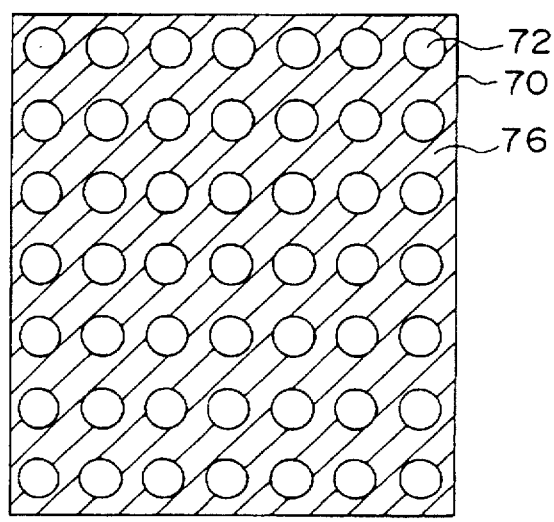
FIG. 15 shows a modified configuration of the fourth embodiment shown in FIG. 14.

As shown in FIG. 15, the solder-repelling coating 76 can be formed on the bottom surface of the device entirely except on the solder bumps 72 instead of the lattice form shown in FIG. 14. The coating 76 can be formed using a known transferring process, dispenser method and so on. Also, it is possible to produce the solder-repelling coating 76 before or after forming the solder bumps 72.

Next, the fifth embodiment of the present invention will be described in detail. The above-mentioned first to fourth embodiments have structural characteristics of the BGA type semiconductor device which improve the reliability of the electrical connection at the soldered junctions. The fifth embodiment is characterized by a use of a semiconductor device mounting board (hereinafter referred to as a middle board). In this embodiment, the difference in thermal expansivity of the materials forming the mother board and the BGA type semiconductor device is taken into account and the difference is adjusted by the middle board in order to improve the reliability of the soldered junctions.

Figure 16:
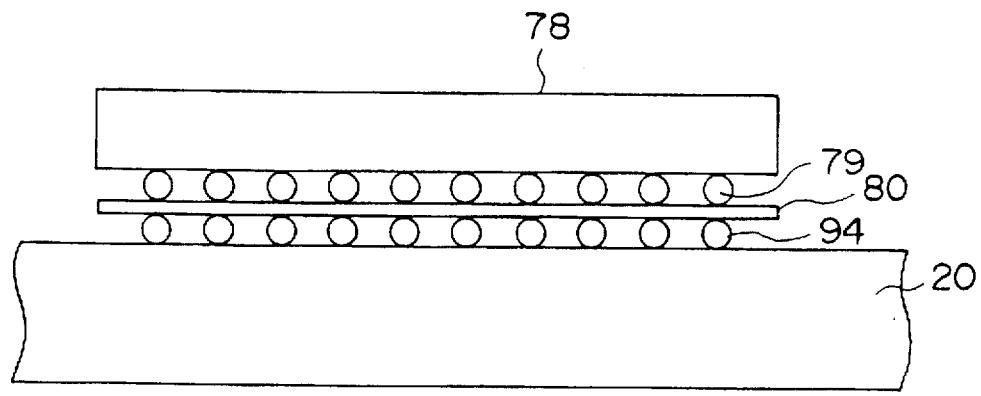
FIG. 16 shows a state in which a semiconductor device is mounted on a mother board using a semiconductor device mounting board (middle board) according to the fifth embodiment of the present invention.

FIG. 16 shows a state in which the BGA type semiconductor device is mounted on the mother board via the middle board. A BGA type semiconductor 78 is mounted on one surface of the middle board 80 and the other surface of a middle board 80 contacts to the mounting surface of the mother board 20.

Figure 17:
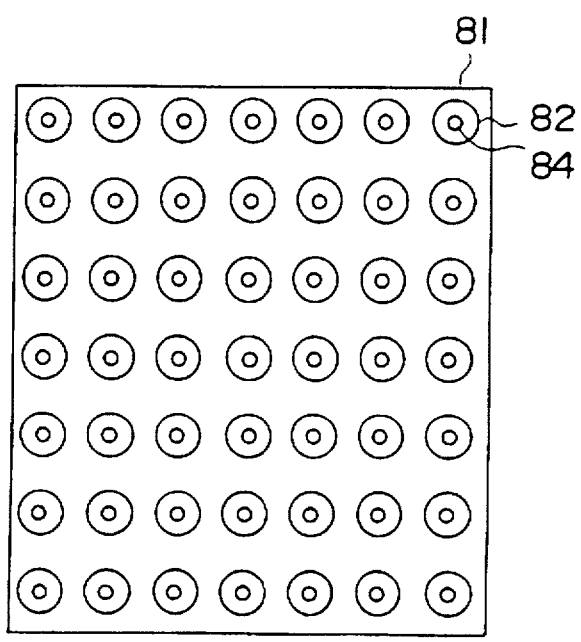
FIG. 17 shows a plan view of the middle board according to the fifth embodiment of the present invention.

FIG. 17 shows an upper surface of the middle board 80 (the surface facing the BGA type semiconductor device). The middle board 80 has a base 81 on which pads 82 corresponding to the solder bumps 79 of the BGA type semiconductor device 78 are provided.

Figure 18:
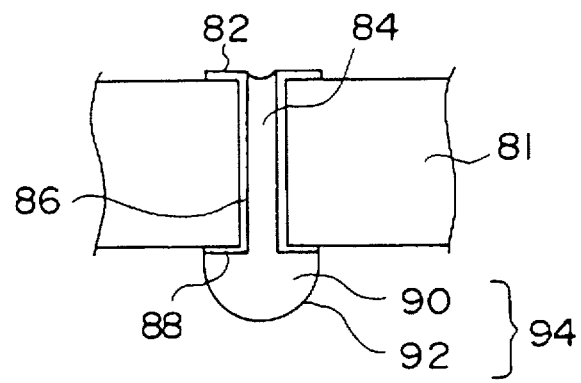
FIG. 18 shows a partial cross-sectional view of the middle board according to the fifth embodiment of the present invention.

As shown in FIGS. 17 and 18, a throughhole 84 is formed in the center of each pad 82 and a connecting conductor 86 is formed inside the throughhole 84. Also, a land 88, which is similar to the pad 82, is formed on the other surface of the base 81 where the pad 82 is provided and the land is connected to the connecting conductor 86. The pad 82, the connecting conductor 86 and the land 88 are formed as a unit using conductive materials such as copper. A copper core 90 which becomes the center of the solder bump 94 is formed on the land 88. When the copper core 90 is formed, the copper is also loaded in the throughhole 84. In addition, Ni—Au plating 92 is formed around the copper core 90.

The solder bumps 79 of the BGA type semiconductor device 80 are mounted on the pads 82 of the middle board 80 and fixed using the reflowing process. Then, solder bumps 94 of the middle board 80 are mounted on the pads 22 of the mother board 20 and fixed using the reflowing method. Thus, the electrical connection is substantially the same as in the case where the pads 79 are directly mounted on the mother board 20.

Figure 1:
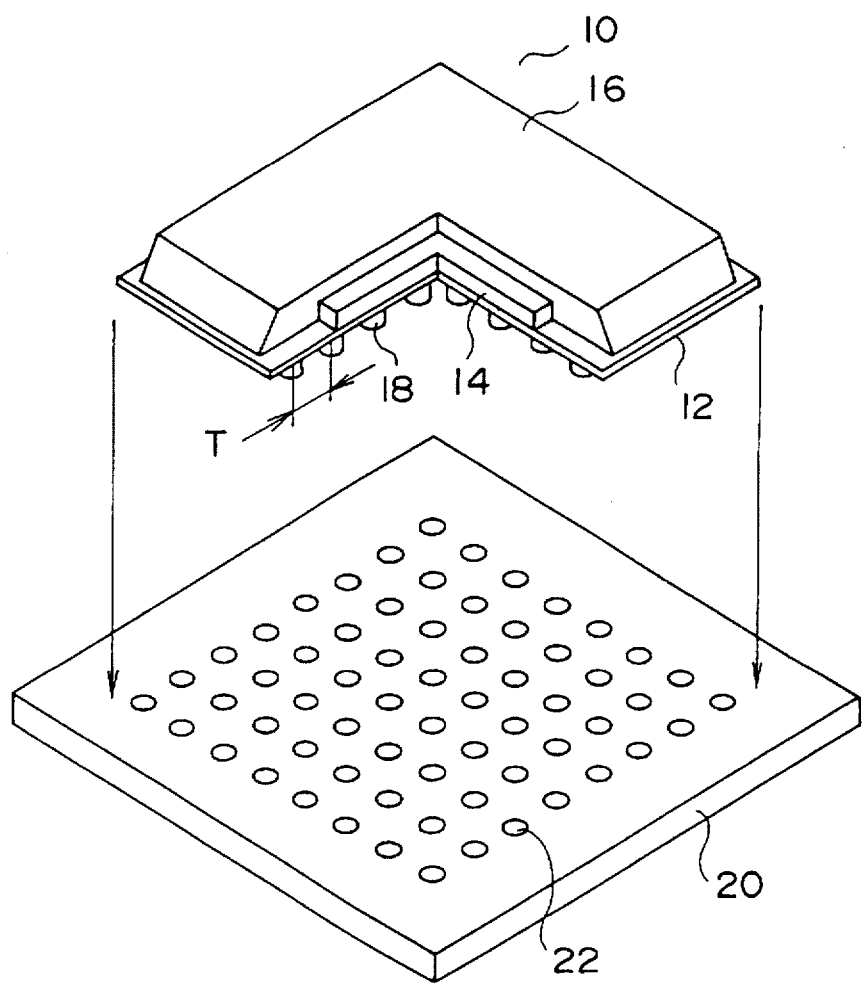
FIG. 1 shows a structure of a conventional BGA type semiconductor device.
Figure 2:
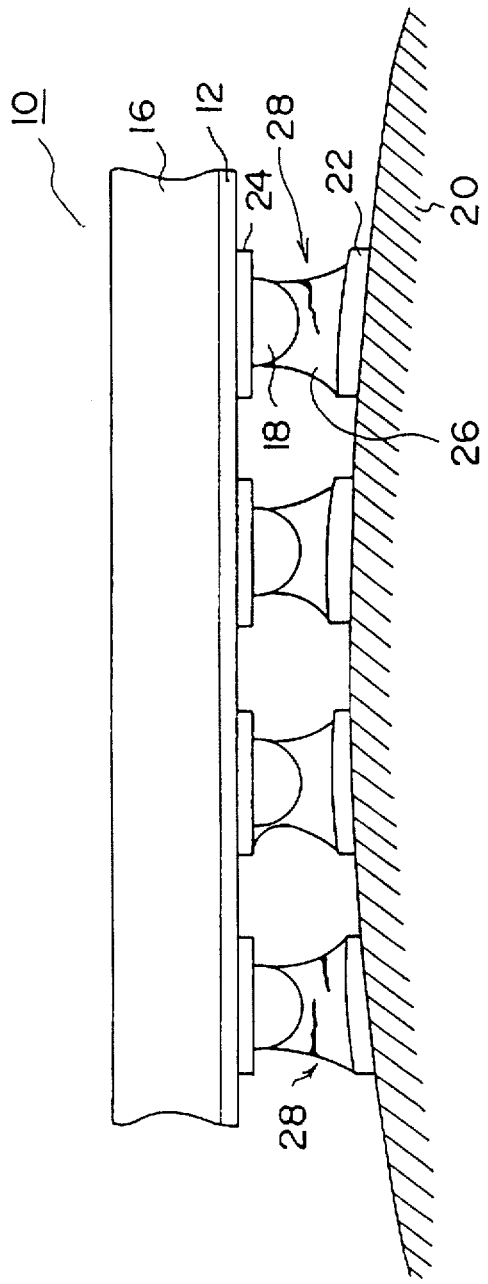
FIG. 2 shows a problem associated with the conventional BGA type semiconductor device.

Now, if the BGA type semiconductor device 78 is directly mounted on the mother board 20, there is a possibility that the situation described in FIG. 2 will occur due to the application of stress to the soldered junctions, caused by the difference in the thermal expansivity of the material forming the package of the BGA type semiconductor device 78 and that of the material forming the mother board 20.

For example, if the package of the BGA type semiconductor device 78 is formed of ceramics, the typical thermal expansion coefficient of ceramics is in the degree of $7*10^{-6}$ (/°C.). On the other hand, if the mother board 20 is formed of glass epoxy, the thermal expansion coefficient of the glass epoxy is approximately $20*10^{-6}$ (/°C.) which is about $13*10^{-6}$ (/°C.) larger than that of ceramics. When the BGA type semiconductor device 78 is mounted using the solder reflowing process, the difference in the degree of thermal expansion is generated between the ceramic and the mother board 20 due to the heat generated during the process and stress will be applied after the soldered junctions are formed and the temperature becomes normal. This stress becomes bigger as the process proceeds to the BGA bumps located at edge portions, and as the size of the package becomes larger. In a state where such stress is applied to the soldered junctions, the reliability of the portion decreases and there is a danger that the above-mentioned cracks are generated in an early stage.

In the fifth embodiment, the above-mentioned base 81 forming the middle board 80 is formed of material(s) having the thermal expansion coefficient between that of the material forming the package of the BGA type semiconductor device 78 and that of the material forming the mother board 20. For example, if the ceramics and the glass epoxy resin, respectively, are used, the base 81 of the middle board 80 will be formed of a composite material of fluororesin and ceramics having the thermal expansion coefficient of about $13*10^{-6}$ (/°C.). When such a middle board 80 is used, the difference in the thermal expansion coefficient between the ceramics and the composite material is about $4*10^{-6}$ (/°C.) at the time of the reflowing process and the difference is almost the same as the one between the composite material and the epoxy resin. Therefore, the difference in the thermal expansion coefficient becomes small and large stress is not applied to the soldered junctions between the BGA type semiconductor device 78 and the middle board 80 and between the middle board 80 and the mother board 20. Thus the reliability in electrical connection between the BGA type semiconductor device 78 and the mother board 20 may be improved.

In addition, since the selection of the materials having a thermal expansion coefficient between the materials forming the package of the BGA type semiconductor device and those forming the mother board is dependent on the selection of the materials forming the package and the mother board, a list of possible combinations thereof will be omitted here.

The sixth embodiment of the present invention will now be described. The sixth embodiment is characterized in that it has a structure which can improve the reliability in electrical connection between the BGA type semiconductor device and the bonding pad which is electrically connected to the solder bump and is supported by the package. More particularly, the sixth embodiment is a BGA type semiconductor device which has a structure to prevent the corrosion of the bonding wire and the bonding pads due to permeated water.

Figure 19:
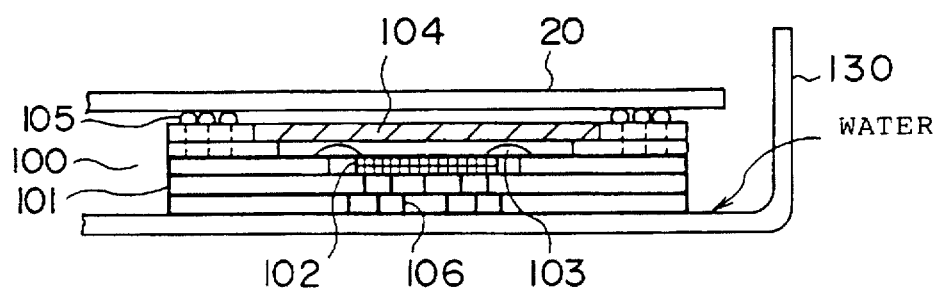
FIG. 19 shows a state in which the BGA device according to the sixth embodiment of the present invention is set in a case of an electrical device.
Figure 1:
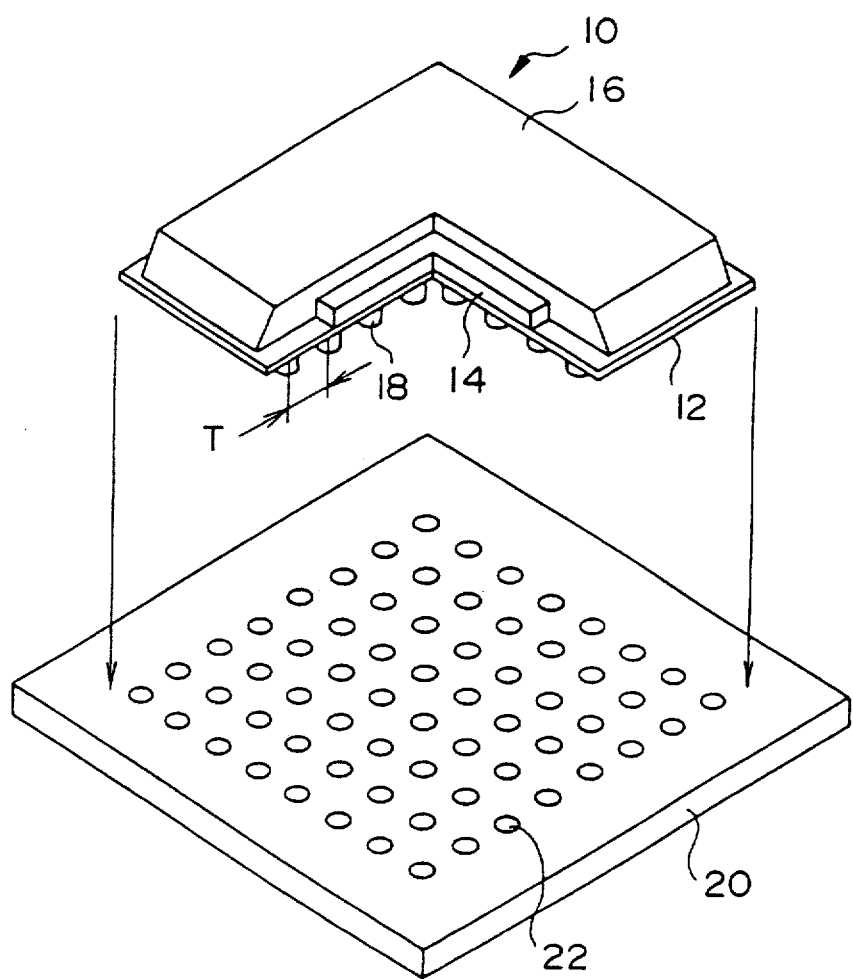
Figure 2:
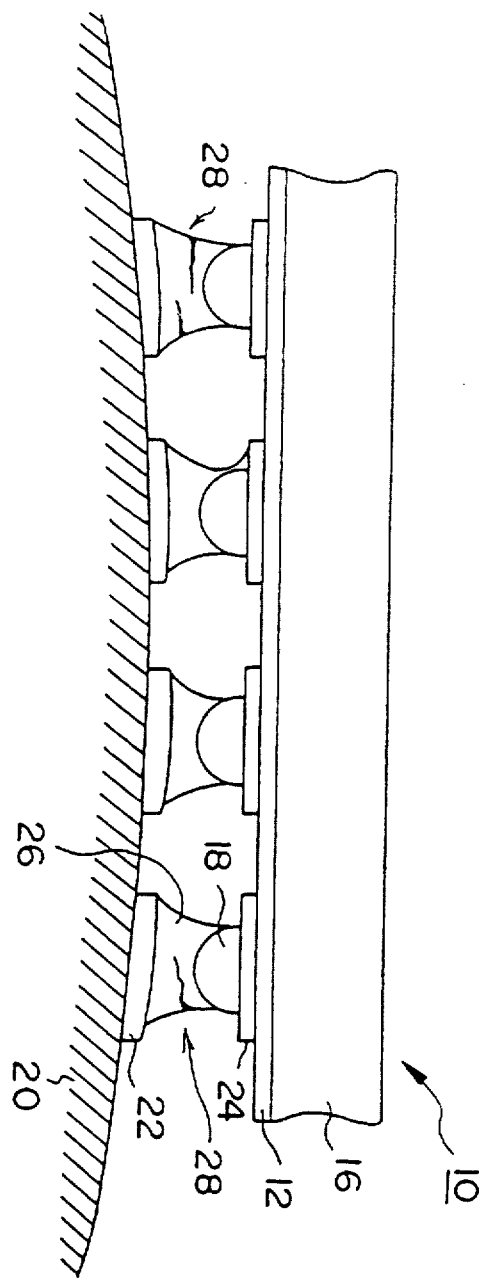
Figure 3:
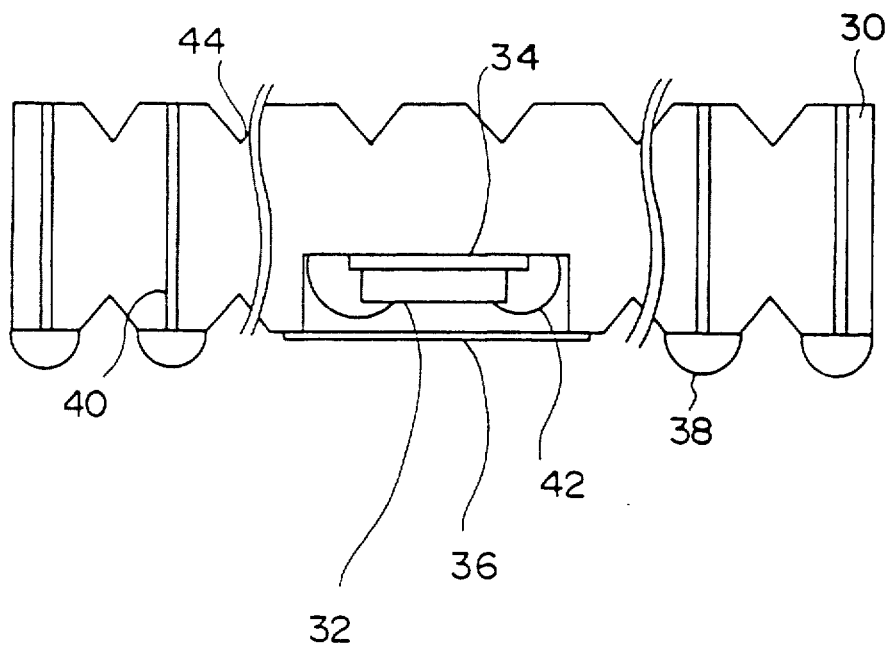
Figure 4:
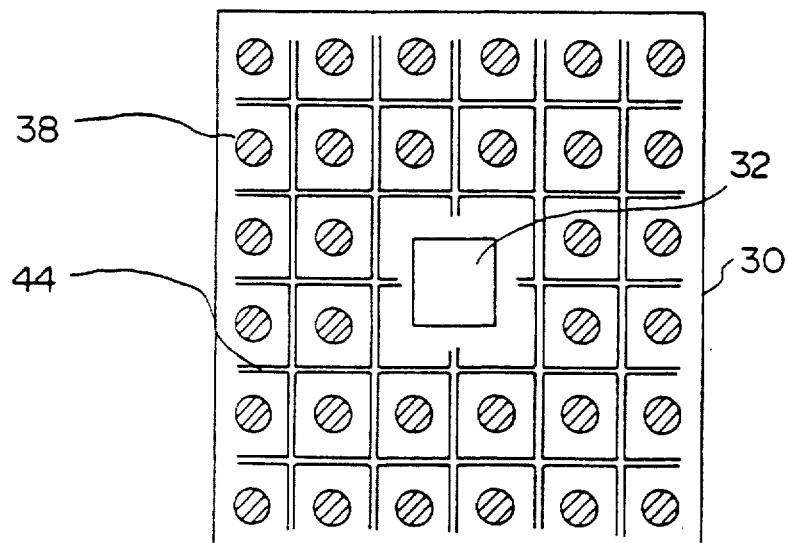

FIG. 19 shows a state in which the BGA type semiconductor device according to the sixth embodiment is fixed to a case 130 of an electrical device such as a computer. The BGA type semiconductor device 100 is comprised of a package 101 of multi-layer structure, a semiconductor chip (bare chip) 102 adhered to a concave portion in the package 101 by epoxy adhesive, etc., a bonding wire 103, a lid 104 formed of epoxy resin, etc. and solder bumps 105. The BGA type semiconductor device 100 of the sixth embodiment is characterized in that thermal vents 106 are provided in a non-straight form in the package 101 of multi-layer structure.

If the back surface of the package 101 of the BGA type semiconductor device 100, which is mounted on the mother board 20 via the solder bumps 105, is fixed to the case 130 formed of metal and so on using silicone adhesive, there is a possibility that water in the case 130 can permeate through the thermal vents 106. In a conventional BGA type semiconductor device, since the thermal vents are formed in straight lines to the semiconductor chip, the water permeates the thermal vents 106 to reach the chip and corrodes the bonding wire.

On the other hand, as the thermal vents 106 for radiating heat are provided in non-straight form in the structure of the sixth embodiment according to the present invention as shown in FIG. 19, even if the water permeates the vent hole 106 contacting the case 130, the possibility that the water will reach the semiconductor chip 102 is very small. Hence, the possibility that the water corrodes the bonding wire is substantially eliminated. According to the experiment conducted by the present inventors, it was confirmed that the occurrence of the corrosion of the bonding pads and the bonding wire of the semiconductor chip 102 is decreased and the life time regarding a moisture resistance of the semiconductor chip 102 becomes 1.5 times longer.

Figure 20:
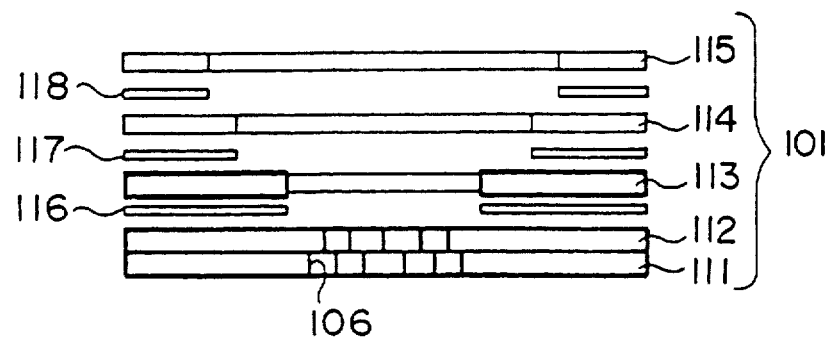
FIG. 20 is a cross-sectional view showing the structure of a package of the BGA type semiconductor device according to the sixth embodiment of the present invention.

FIG. 20 shows a detailed diagram of the package 101 shown in FIG. 19. In FIG. 20, the package 101 has a five-layer structure and is comprised of five glass epoxy plates 111–115. Patterned copper thin coatings (indicated by bold line in FIG. 20) are formed on both sides of the glass epoxy plates 111–113 and the glass epoxy plates 112–115 are fixed to each other by adhesive resin sheets 116–118. Moreover, throughholes in which a connecting conductor such as copper is provided are formed after the layers are laminated and solder bumps 105 are formed on the land portions. The throughholes are indicated by broken lines in FIG. 19.

Figure 21A:
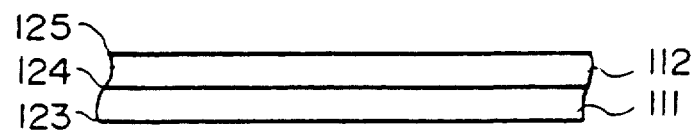
FIG. 21A shows a first stage of a manufacturing process of a part of the package shown in FIG. 20.
Figure 21B:
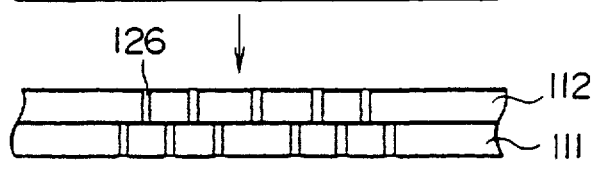
FIG. 21B shows a second stage of a manufacturing process of a part of the package shown in FIG. 20.
Figure 21C:
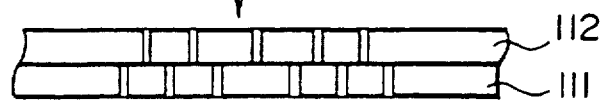
FIG. 21C shows a third stage of a manufacturing process of a part of the package shown in FIG. 20.

FIGS. 21A to 21C show a manufacturing process of the glass epoxy plates 111 and 112 shown in FIG. 20. Firstly, the two glass epoxy plates 111 and 112, each of which has thin copper coatings 123, 124, 125 formed on both sides, are put together as shown in FIG. 21A. Then throughholes 126 are formed from the both sides using appropriate tools as shown in FIG. 21B. Finally, the thermal vents 106 are formed by metal plating the inside of the throughholes 126 using copper, for example, as shown in FIG. 21C.

It is obvious that the present invention is not limited to these embodiments, and variations and modifications may be made without departing from the scope of the present invention.

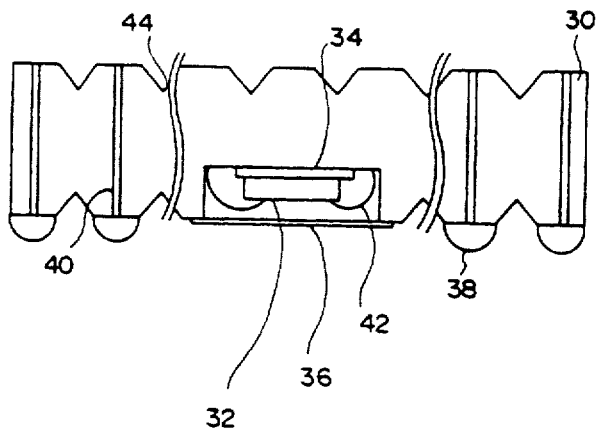

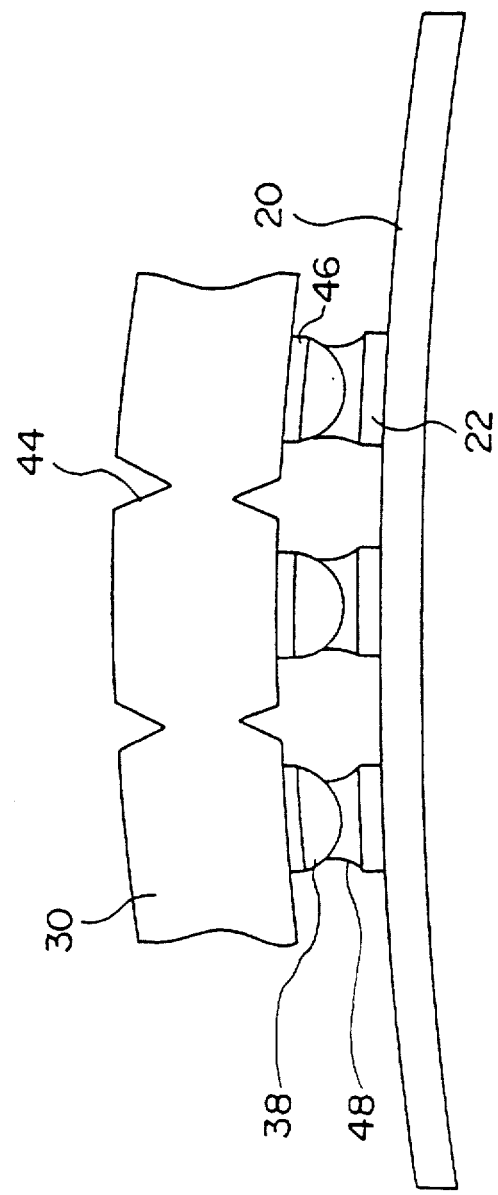

What is claimed is:

1. A semiconductor device comprising:
   a package having opposing surfaces, each opposing surface having slits formed thereon,
   a first terminal supported by said package;
   an electronic component supported by said package; and
   a mother board supporting a second terminal,
   wherein the slits allow a shape of said package to be changed in a mounted state, when said first terminal is connected by a soldered junction to said second terminal provided on the mother board, so that stress applied to the soldered junction of said first and second terminals can be decreased.

2. The semiconductor device as claimed in claim 1,
   wherein said slits are formed in straight lines extending in two different directions.

3. The semiconductor device as claimed in claim 1,
   wherein each of said slits has a cross-section of substantially V-shape.

4. The semiconductor device as claimed in claim 1,
   wherein said first terminal includes at least one solder bump having substantially a ball-shape.

5. A semiconductor device, comprising:
   a substantially planar package having first and second opposing surfaces;
   a slit formed on each surface; and
   a first terminal supported by said package for electrically connecting the package to a second terminal provided on a mother board,
   wherein, when the package is mounted on the mother board, the slit makes the package flexible to conform to a non-planar shape of the mother board.

6. The semiconductor device as claimed in claim 5,
   wherein the slit on each surface is a plurality of slits, and
   wherein said plurality of slits on each surface is formed in straight lines extending in first and second different directions.

7. The semiconductor device as claimed in claim 5,
   wherein each of said slits has a cross-section of substantially V-shape.

8. The semiconductor device as claimed in claim 5,
   wherein said first terminal is a solder bump having substantially a ballshape.

9. The semiconductor device as recited in claim 5,
   wherein the slit is a plurality of slits, a majority of which is formed at a periphery of the package.

10. The semiconductor device as claimed in claim 6,
    wherein the first direction is perpendicular to the second direction.

11. A semiconductor device comprising:
    a substantially planar package having first and second opposing surfaces;
    a slit formed on each surface; and
    a first terminal supported by said package for electrically connecting the package to a second terminal provided on a mother board,
    wherein, when the package is mounted on the mother board, the slit makes the package flexible to conform to a non-planar shape of the mother board,
    wherein the first terminal is a plurality of first terminals,
    wherein the slit is a plurality of slits, and
    wherein each slit is located between two of the first terminals.

12. The semiconductor device as claimed in claim 11, p1 wherein the slits are formed in longitudinal and transverse directions crossing each other between each of the first terminals.

13. The semiconductor device as claimed in claim 11,
    wherein said plurality of slits on each surface is formed in straight lines extending in first and second different directions.

14. The semiconductor device as claimed in claim 11,
    wherein each of said slits has a cross-section of substantially V-shape.

15. The semiconductor device as claimed in claim 11,
    wherein said first terminal is a solder bump having substantially a ball-shape.

16. The semiconductor package as recited in claim 11,
    wherein the slit on each surface is a plurality of slits, a majority of which is formed at a periphery of the package.

17. The semiconductor device as claimed in claim 13,
    wherein the first direction is perpendicular to the second direction.

18. A semiconductor device, comprising:
    a substantially planar package having first and second opposing surfaces;
    a slit formed on each surface; and
    a first terminal supported by said package for electrically connecting the package to a second terminal provided on a mother board,
    wherein, when the package is mounted on the mother board, the slit makes the package flexible to conform to a non-planar shape of the mother board,
    wherein the slit is a plurality of slits, a majority of which is formed at a central area of the package.

19. The semiconductor device as claimed in claim 18,
    wherein said plurality of slits on each surface is formed in straight lines extending in first and second different directions.

20. The semiconductor device as claimed in claim 18,
    wherein each of said slits has a cross-section of substantially V-shape.

21. The semiconductor device as claimed in claim 18,
    wherein said first terminal is a solder bump having substantially a ball-shape.

22. The semiconductor device as claimed in claim 19,
    wherein the first direction is perpendicular to the second direction.

23. A semiconductor device, comprising:

a package having first and second opposing surfaces, each opposing surface having slits formed thereon which do not extend to the opposing surface;

a through hole extending between and opening to said first and second surfaces;

a first terminal supported by said package;

an electronic component supported by said package; and a mother board supporting a second terminal, wherein, when the package is mounted on the mother board, the slits make the package flexible to conform to a non-planar shape of the mother board.

* * * * *

UNITED STATES PATENT AND TRADEMARK OFFICE
CERTIFICATE OF CORRECTION

PATENT NO. : 5,760,469

DATED : June 2, 1998

INVENTOR(S) : Yutaka HIGASHIGUCHI et al.

It is certified that error appears in the above-identified patent and that said Letters Patent is hereby corrected as shown below:

Title page should be deleted and replaced with the attached title page.

In the Drawings, replace sheets 1-6 and 13 with the corrected versions of the drawings attached drawings.

Col. 3, line 30, delete "of".

Col. 12, line 22 (claim 12, line 1), delete "p1".

Signed and Sealed this

Fifteenth Day of September, 1998

Attest:

BRUCE LEHMAN

*Attesting Officer*     *Commissioner of Patents and Trademarks*

United States Patent [19]

Higashiguchi et al.

[11] Patent Number: 5,760,469
[45] Date of Patent: Jun. 2, 1998

[54] SEMICONDUCTOR DEVICE AND SEMICONDUCTOR DEVICE MOUNTING BOARD

[75] Inventors: Yutaka Higashiguchi; Mitsuo Inagaki; Toshio Kumai; Ryoichi Ochiai; Yasuhiro Teshima; Mamoru Niishiro; Yasushi Kobayashi; Hideaki Tamura; Hiroshi Iimura; Seishi Chiba; Yukio Sekiya; Shuzo Igarashi; Yasuhiro Ichihara, all of Kawasaki, Japan

[73] Assignee: Fujitsu Limited, Kawasaki, Japan

[21] Appl. No.: 602,421

[22] Filed: Feb. 16, 1996

[30] Foreign Application Priority Data

Jul. 31, 1995 [JP] Japan ................. 7-195456

[51] Int. Cl.$^6$ ............... H01L 23/02; H01L 23/48; H01L 23/52; H01L 29/40
[52] U.S. Cl. ............... 257/678; 257/693; 257/698; 257/774; 438/106
[58] Field of Search ............... 257/690, 692, 257/693, 697, 698, 787, 792, 796, 678, 780, 774, 688, 786, 684; 438/375, 376, 377, 378, 55

[56] References Cited

U.S. PATENT DOCUMENTS 5,309,026  5/1994  Matsumoto .................. 257/787

FOREIGN PATENT DOCUMENTS 2-041451  3/1990  Japan .
5144995   6/1993  Japan .................. 257/700
6053362   2/1994  Japan .................. 257/796

Primary Examiner—Mahshid D. Saadat
Assistant Examiner—Jhihan B. Clark
Attorney, Agent, or Firm—Staas & Halsey

[57] ABSTRACT

A semiconductor device includes a package having opposing surfaces, a first terminal for an outer connection supported by said package and electronic components supported by said package, and the opposing surfaces of the package having slits so that a shape of the package can be changed in a mounted state. Therefore, stress applied to soldered junctions of the first and second terminals is decreased.

23 Claims, 14 Drawing Sheets